(12) United States Patent
Yamada

(10) Patent No.: US 11,611,329 B2
(45) Date of Patent: Mar. 21, 2023

(54) VIBRATING ELEMENT, VIBRATOR, ELECTRONIC DEVICE, AND VEHICLE

(71) Applicant: Seiko Epson Corporation, Tokyo (JP)

(72) Inventor: Akinori Yamada, Ina (JP)

(73) Assignee: SEIKO EPSON CORPORATION

( * ) Notice: Subject to any disclaimer, the term of this patent is extended or adjusted under 35 U.S.C. 154(b) by 300 days.

(21) Appl. No.: 16/923,181

(22) Filed: Jul. 8, 2020

(65) Prior Publication Data

US 2021/0013869 A1    Jan. 14, 2021

(30) Foreign Application Priority Data

Jul. 9, 2019   (JP) .............................. JP2019-127465

(51) Int. Cl.
  *H03H 9/19*    (2006.01)
  *H03H 9/10*    (2006.01)
  *H03H 9/05*    (2006.01)

(52) U.S. Cl.
  CPC ............ *H03H 9/19* (2013.01); *H03H 9/0509* (2013.01); *H03H 9/1021* (2013.01)

(58) Field of Classification Search
  CPC ...... H03H 9/19; H03H 9/0509; H03H 9/1021; H03H 9/02157; B06B 1/12
  See application file for complete search history.

(56) References Cited

U.S. PATENT DOCUMENTS

| 8,304,968 | B2* | 11/2012 | Tanaya | .................. H03H 9/215 331/158 |
| 2013/0076210 | A1* | 3/2013 | Minegishi | ................ H03H 9/21 310/370 |
| 2014/0368288 | A1 | 12/2014 | Yamada | |
| 2015/0188513 | A1 | 7/2015 | Yamada et al. | |
| 2017/0244340 | A1 | 8/2017 | Ichimura | |

FOREIGN PATENT DOCUMENTS

| CN | 104242866 A | 12/2014 |
| JP | 2002-141770 A | 5/2002 |
| JP | 2005-150992 A | 6/2005 |
| JP | 2015-128262 A | 7/2015 |
| JP | 2017-152835 A | 8/2017 |

* cited by examiner

*Primary Examiner* — Jeffrey M Shin
(74) *Attorney, Agent, or Firm* — Harness, Dickey & Pierce, P.L.C.

(57) ABSTRACT

A vibrating element includes a base and a first vibrating arm and a second vibrating arm extending from the base. The first vibrating arm includes a first arm and a first weight. The second vibrating arm includes a second arm and a second weight. In the vibrating element, $0.952 < M2/M1 < 1.000$, wherein M1 is mass on the second vibrating arm side of the first weight with respect to a first center line of the first arm and mass on the first vibrating arm side of the second weight with respect to a second center line of the second arm and M2 is mass on a side opposite to the second vibrating arm of the first weight with respect to the first center line and mass on a side opposite to the first vibrating arm of the second weight with respect to the second center line.

8 Claims, 14 Drawing Sheets

VIBRATING ELEMENT, VIBRATOR, ELECTRONIC DEVICE, AND VEHICLE

The present application is based on, and claims priority from JP Application Serial Number 2019-127465, filed Jul. 9, 2019, the disclosure of which is hereby incorporated by reference herein in its entirety.

BACKGROUND

1. Technical Field

The present disclosure relates to a vibrating element, a vibrator, an electronic device, and a vehicle.

2. Related Art

JP-A-2002-141770 (Patent Literature 1) discloses a vibrator including bar-like two legs, a base combined with one end portions of the two legs, and two weight sections respectively combined with the other end portions of the two legs, the vibrator being integrally configured at the same thickness, the distance between the centers of gravity of the two weight sections being shorter than the distance between the centers of gravity of the two legs.

With the vibrating element described in Patent Literature 1, by setting the distance between the centers of gravity of first and second weight sections functioning as the two weight sections shorter than the distance between the centers of gravity of first and second vibrating arms functioning as the two legs, it is possible to realize a vibrating element having a high Q value and having a less vibration leak. However, specific numerical values are neither disclosed nor indicated about the distances between the centers of gravity and the Q value. Therefore, with this configuration, it has been difficult to realize a vibrating element having a high Q value.

SUMMARY

A vibrating element includes: a base; and a first vibrating arm and a second vibrating arm extending from the base along a first axis and arranged side by side along a second axis crossing the first axis. The first vibrating arm includes a first arm extending from the base and a first weight coupled to a distal end of the first arm. The second vibrating arm includes a second arm extending from the base and a second weight coupled to a distal end of the second arm. In the vibrating element, $0.952 < M2/M1 < 1.000$, wherein M1 is mass on the second vibrating arm side of the first weight with respect to a first imaginary center line passing a center of width along the second axis of the first arm and mass on the first vibrating arm side of the second weight with respect to a second imaginary center line passing a center of width along the second axis of the second arm and M2 is mass on a side opposite to the second vibrating arm of the first weight with respect to the first imaginary center line and mass on a side opposite to the first vibrating arm of the second weight with respect to the second imaginary center line.

In the vibrating element, width along the second axis of the first weight may be larger than the width along the second axis of the first arm, width along the second axis of the second weight may be larger than the width along the second axis of the second arm, and, in a plan view including the first axis and the second axis, it may be $0.952 < S2/S1 < 1.000$, wherein S1 is an area on the second vibrating arm side of the first weight with respect to the first imaginary center line and an area on the first vibrating arm side of the second weight with respect to the second imaginary center line and S2 is an area on the side opposite to the second vibrating arm of the first weight with respect to the first imaginary center line and an area on the side opposite to the first vibrating arm of the second weight with respect to the second imaginary center line.

In the vibrating element, it may be $0.957 < M2/M1 < 0.991$.

In the vibrating element, it may be $0.957 < S2/S1 < 0.991$.

In the vibrating element, in a plan view including the first axis and the second axis, the first weight and the second weight may be formed in a rectangular shape, a corner on a side apart from the distal end of the first arm and a side apart from the second weight in the first weight may be chamfered and a corner on a side apart from the distal end of the second arm and a side apart from the first weight in the second weight may be chamfered.

In the vibrating element, the vibrating element may include a metal member on a surface of at least one of the first weight and the second weight.

A vibrator includes: the vibrating element; and a package that houses the vibrating element.

An electronic device includes the vibrating element.

A vehicle includes the vibrating element.

DESCRIPTION OF EXEMPLARY EMBODIMENTS

1. First Embodiment

Figure 1:
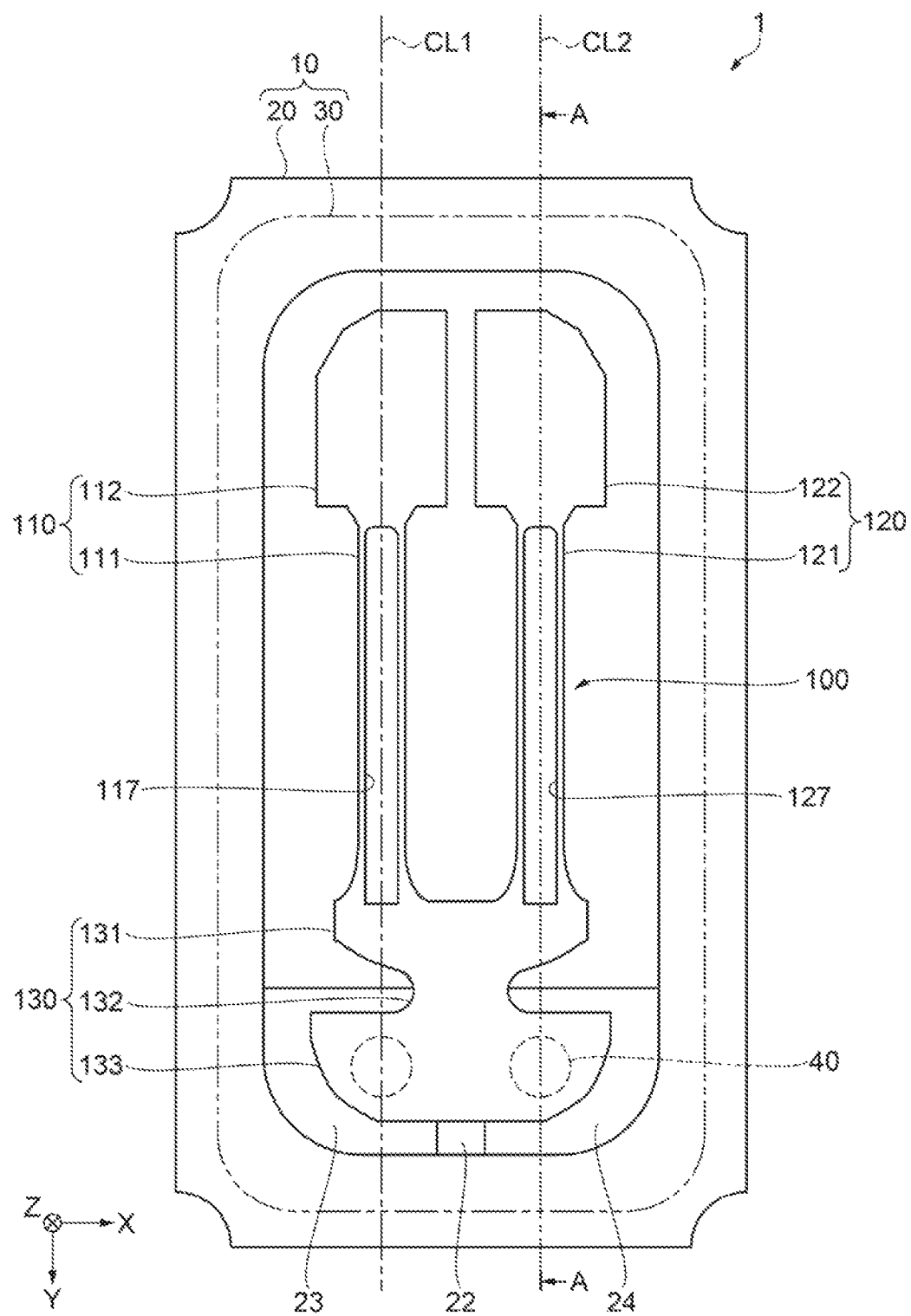
FIG. 1 is a plan view showing the configuration of a vibrator according to a first embodiment.
Figure 2:
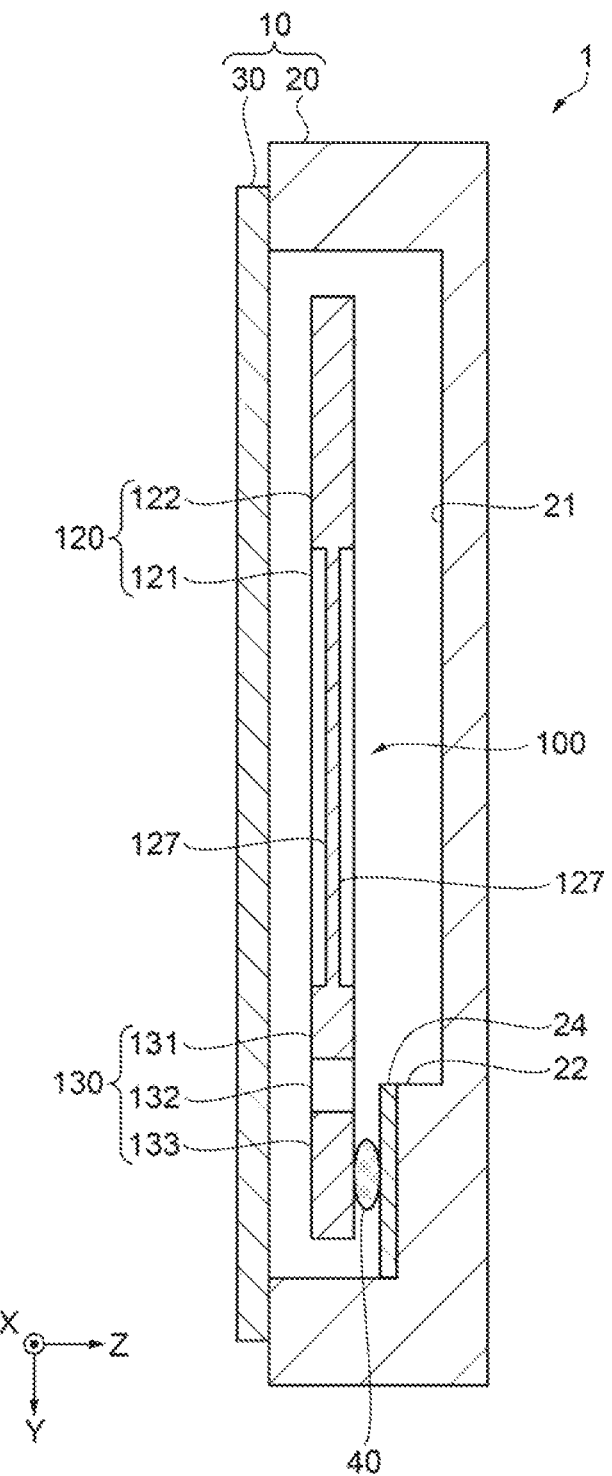
FIG. 2 is a sectional view taken along an A-A line in FIG. 1.
Figure 3:
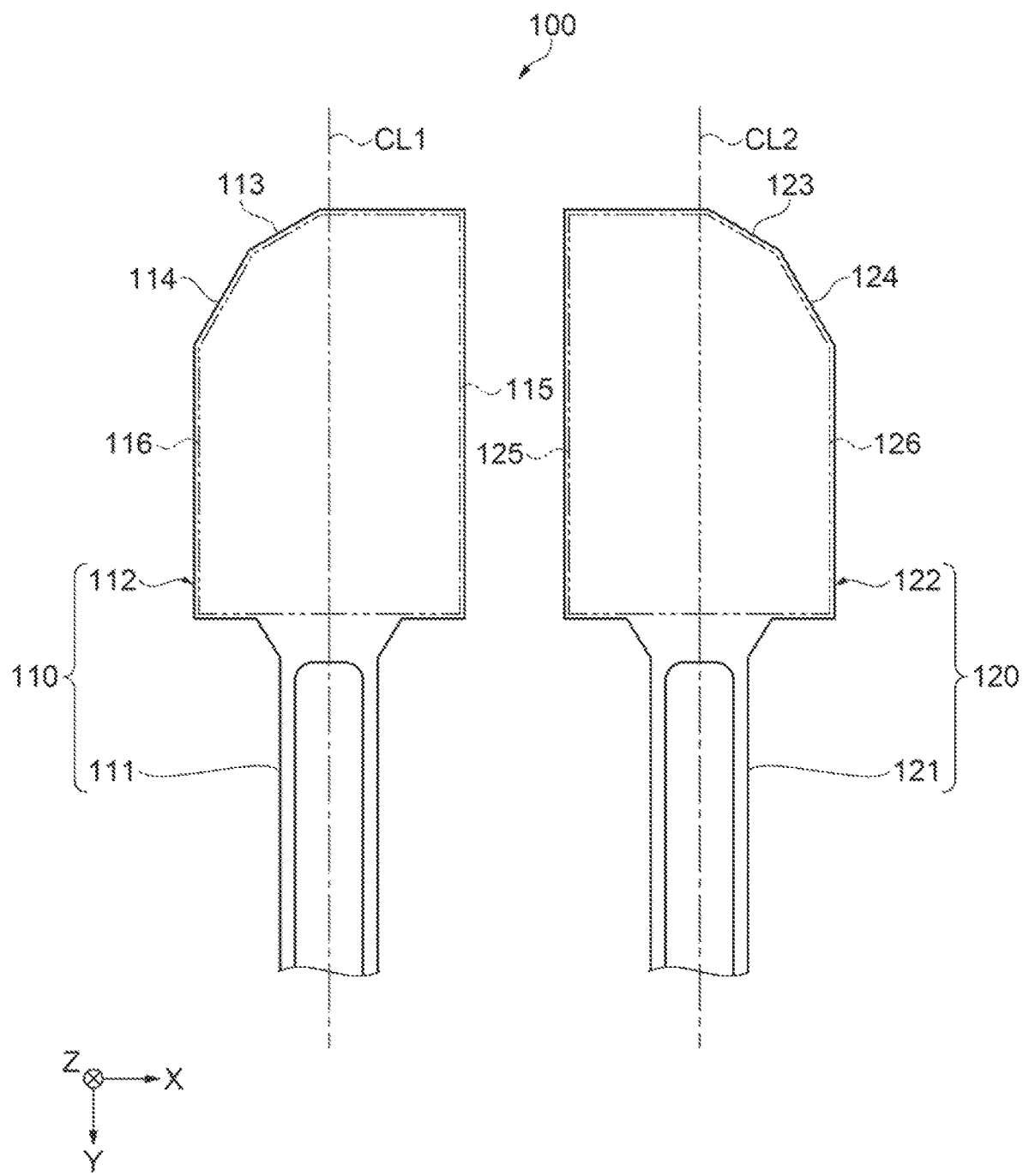
FIG. 3 is a plan view enlarging and showing a first weight and a second weight of a vibrating element.
Figure 4:
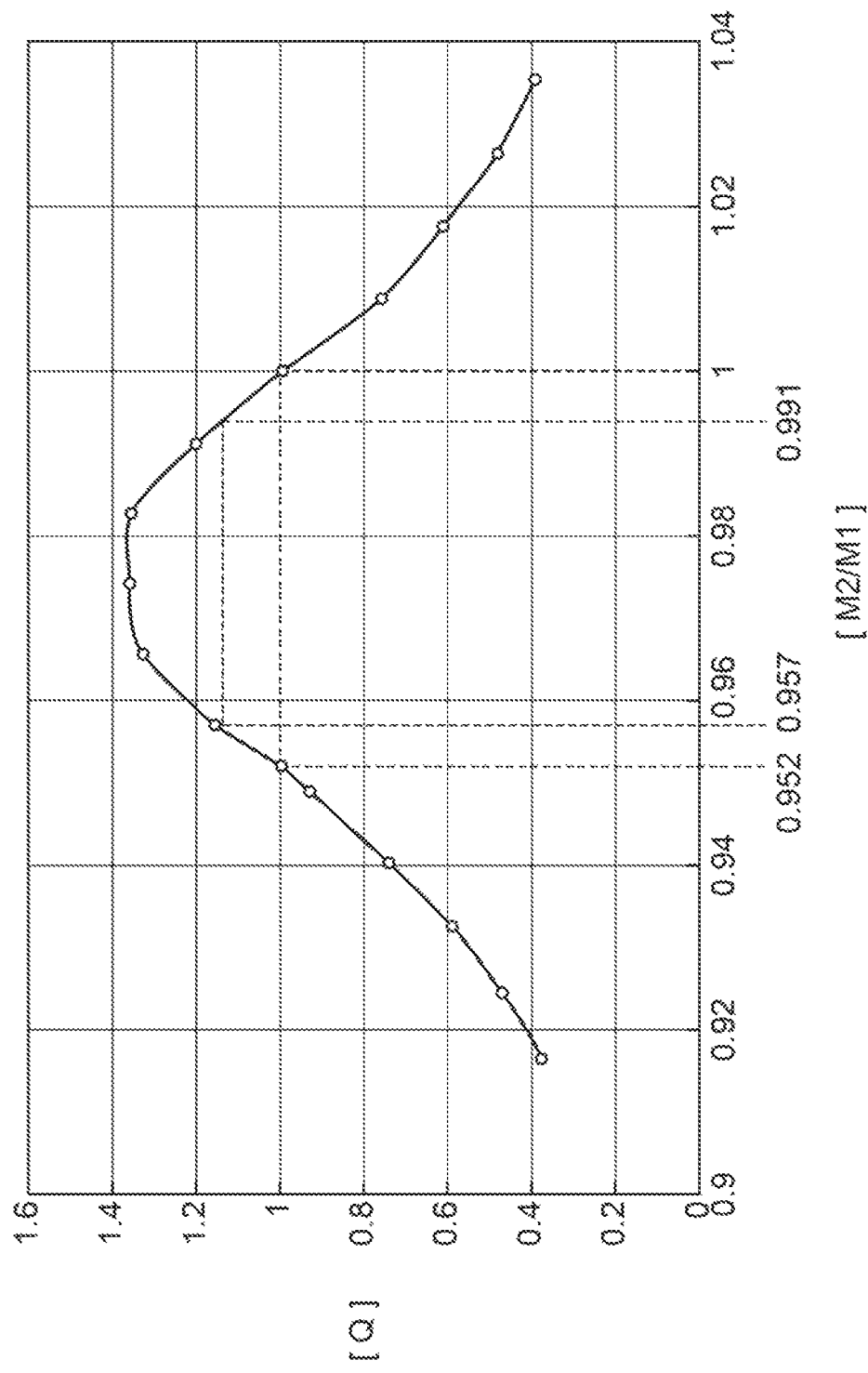
FIG. 4 is a graph for explaining a relation between a mass ratio of the weights and a Q value.

FIG. 1 is a plan view showing the configuration of a vibrator according to a first embodiment. FIG. 2 is a sectional view taken along an A-A line in FIG. 1. FIG. 3 is a plan view enlarging and showing a first weight and a second weight of a vibrating element. FIG. 4 is a graph for explaining a relation between a mass ratio of the weights and a Q value. In the figures referred to below, an X axis, a Y axis, and a Z axis orthogonal to one another are illustrated according to necessity. A distal end side of arrows is represented as "plus side" and a proximal end side of the arrows is represented as "minus side". Both directions along the Z axis are upper and lower directions. The plus side of the directions is referred to as "lower" as well and the minus side of the directions is referred to as "upper" as well. The first axis corresponds to the Y axis. The second axis corresponds to the X axis.

As shown in FIGS. 1 and 2, a vibrator 1 includes a vibrating element 100 and a package 10 that houses the vibrating element 100.

1-1. Package

The package 10 includes a box-like base 20 including a recess 21 opened on the upper surface of the base 20 and a plate-like lid 30 bonded to the base 20 to close the opening of the recess 21. In a plan view including the X axis and the Y axis, the recess 21 of the base 20, that is, the inner wall of the base 20 is formed in a rectangular shape, corners of which are formed in a curved line shape, in order to improve the strength of the base 20. Such a package 10 includes a housing space formed by closing the recess 21 with the lid 30. The vibrating element 100 is hermetically housed in the housing space. A step section 22 is provided in the recess 21. The vibrating element 100 is fixed to the step section 22 via a conductive adhesive 40 obtained by mixing a conductive filler in, for example, epoxy, silicon, bismaleimide, or acrylic resin.

The housing space may be in a decompressed state or a vacuum state. An inert gas such as nitrogen, helium, or argon may be encapsulated in the housing space. Consequently, a vibration characteristic of the vibrating element 100 is improved.

A constituent material of the base 20 is not particularly limited. Various ceramics such as aluminum oxide can be used. The constituent material of the lid 30 is not particularly limited and is desirably a member having a coefficient of linear expansion approximate to the coefficient of liner expansion of the constituent material of the base 20. For example, when the constituent material of the base 20 is the ceramics described above, the constituent material of the lid 30 is preferably an alloy such as Kovar. The bonding of the base 20 and the lid 30 is not particularly limited. For example, the base 20 and the lid 30 may be bonded via an adhesive or may be bonded by melting metal as in seam welding or heat welding.

Connection terminals 23 and 24 are formed in the step section 22 of the base 20. The vibrating element 100 is electrically coupled to the connection terminals 23 and 24 via the conductive adhesive 40. The connection terminals 23 and 24 are electrically coupled to, via a through-electrode or the like that pierces through the base 20, an external terminal formed on the bottom surface of the base 20.

The configurations of the connection terminals 23 and 24, the through-electrode, and the external terminal are not particularly limited if the connection terminals 23 and 24, the through-electrode, and the external terminal respectively have conductivity. The connection terminals 23 and 24, the through-electrode, and the external terminal can be configured by a metal film obtained by laminating films of nickel (Ni), gold (Au), silver (Ag), copper (Cu), or the like on a metalized layer of chrome (Cr), tungsten (W), molybdenum (Mo), or the like.

1-2. Vibrating Element

The vibrating element 100 is configured by a Z-cut quartz crystal plate and an electrode formed on the Z-cut quartz crystal plate. Consequently, the vibrating element 100 can exert an excellent vibration characteristic. The Z-cut quartz crystal plate is a quartz crystal substrate having the Z axis, which is the optical axis of quartz crystal, as a thickness direction. The Z axis of quartz crystal preferably coincides with the thickness direction of the vibrating element 100 but may be slightly inclined with respect to the thickness direction. "Slightly" means approximately 15° or less.

The vibrating element 100 includes a base 130 and a first vibrating arm 110 and a second vibrating arm 120 extending from the base 130 to the minus side of the Y axis and arranged side by side along the X axis. The base 130 is formed in a plate shape spreading on an XY plane, which is a plane parallel to the X axis and the Y axis, and having the Z axis as a thickness direction. The base 130 is formed in a shape constricted in a halfway portion in the direction along the Y axis of the base 130 in the plan view including the X axis and the Y axis. That is, the base 130 includes a first base 131, from which the first and second vibrating arms 110 and 120 extend, a second base 133 provided on a side opposite to the first and second vibrating arms 110 and 120 with respect to the first base 131, and a coupling section 132 that couples the first base 131 and the second base 133. Both corners on the plus side along the Y axis of the second base 133 are chamfered along the inner wall of the base 20. The second base 133 is fixed to the connection terminals 23 and 24 of the package 10 via the conductive adhesive 40. The coupling section 132 is smaller in the width in the width direction along the X axis than the first base 131. Consequently, it is possible to reduce a vibration leak while reducing the length along the Y axis of the base 130.

The first vibrating arm 110 includes a first arm 111 extending from the base 130 and a first weight 112 coupled to the distal end of the first arm 111. The second vibrating arm 120 includes a second arm 121 extending from the base 130 and a second weight 122 coupled to the distal end of the second arm 121. The first and second vibrating arms 110 and 120 are configured in parallel to each other along the Y axis. The width along the X axis of the first and second weights 112 and 122 is larger than the width along the X axis of the first and second arms 111 and 121. Consequently, it is possible to achieve a reduction in a vibration frequency in the vibrating element 100 and achieve a reduction in the size in the direction along the Y axis of the first and second vibrating arms 110 and 120.

The first vibrating arm 110 includes a pair of bottomed grooves 117 opened on a pair of principal planes, which is formed by the XY plane, and extending along the Y axis. The first vibrating arm 110 is formed in a substantially H-shaped cross sectional shape in a portion where the pair of grooves 117 is formed. The second vibrating arm 120 includes a pair of bottomed grooves 127 opened on a pair of principal planes, which is formed by the XY plane, and extending along the Y axis. The second vibrating arm 120 is formed in a substantially H-shaped cross sectional shape in a portion where the pair of grooves 127 is formed. By forming such grooves 117 and 127, it is possible to reduce a thermoelastic loss.

Although not illustrated, a pair of first electrodes for driving is formed on the inner surfaces of the pair of grooves 117 of the first vibrating arm 110. A pair of second electrodes for driving is formed on a pair of side surfaces of the first vibrating arm 110. A pair of second electrodes for driving is formed on the inner surfaces of the pair of grooves 127 of the second vibrating arm 120. A pair of first electrodes for driving is formed on a pair of side surfaces of the second vibrating arm 120. When an alternating voltage is applied between the first electrodes for driving and the second electrodes for driving formed in this way, the first and second vibrating arms 110 and 120 vibrate at a predetermined frequency to repeat approach and separation each other.

A constituent material of the first and second electrodes for driving is not particularly limited. The first and second electrodes for driving can be formed by conductive materials such as metal materials such as gold (Au), a gold alloy, platinum (Pt), aluminum (Al), an aluminum alloy, silver (Ag), a silver alloy, chrome (Cr), a chrome alloy, nickel (Ni), copper (Cu), molybdenum (Mo), niobium (Nb), tungsten (W), iron (Fe), titanium (Ti), cobalt (Co), zinc (Zn), and zirconium (Zr) and indium tin oxide (ITO) or a configuration obtained by laminating these conductive materials.

1-3. Configurations of the Weights

The configurations of the first weight 112 and the second weight 122 are explained.

As shown in FIGS. 1 and 3, the first weight 112 of the first vibrating arm 110 is formed in a long rectangular shape along the Y axis. The width along the X axis of the first weight 112 is larger than the width along the X axis of the first arm 111. In the plan view, in the first weight 112, a corner on a side away from the second weight 122 and a side away from the distal end of the first arm 111 in the first weight 112 is chamfered. In this embodiment, in the first weight 112, a first chamfered section 113 and a second chamfered section 114 are formed at a corner formed by the minus side along the X axis and the minus side along the Y axis. The first weight 112 may further includes a chamfer at a corner formed by the minus side along the X axis and the plus side along the Y axis.

The second weight 122 of the second vibrating arm 120 is formed in a long rectangular shape along the Y axis. The width along the X axis of the second weight 122 is larger than the width along the X axis of the second arm 121. In the plan view, in the second weight 122, a corner on a side away from the first weight 112 and a side away from the distal end of the second arm 121 in the second weight 122 is chamfered. In this embodiment, in the second weight 122, a first chamfered section 123 and a second chamfered section 124 are formed at a corner formed by the plus side along the X axis and the minus side along the Y axis. The second weight 122 may further includes a chamfer at a corner formed by the plus side along the X axis and the plus side along the Y axis.

The first chamfered sections 113 and 123 are formed such that an inner angle formed by the first chamfered sections 113 and 123 and the X axis is approximately 30°. The second chamfered sections 114 and 124 are formed such that an inner angle formed by the second chamfered sections 114 and 124 and the X axis is approximately 60°. Since the first chamfered sections 113 and 123 and the second chamfered sections 114 and 124 are along a crystal plane of quartz crystal, the corners can be suitably chamfered. The first weight 112 and the second weight 122 can be chamfered along the inner wall of the base by the first chamfered sections 113 and 123 and the second chamfered sections 114 and 124. Since the four corners of the vibrating element 100 are chamfered along the shape of the inner wall of the base 20, the vibrating element 100 can be mounted in a package smaller than a vibrating element not chamfered. In this embodiment, one corner is formed by two chamfered sections. However, one corner may be chamfered by one chamfered section or three or more chamfered sections or may be chamfered in a curved line shape.

In the plan view including the X axis and the Y axis, the first weight 112 is configured by a first region 115 and a second region 116. The first region 115 is a region on the second vibrating arm 120 side of the first weight 112 with respect to a first imaginary center line CL1 passing the center of the width along the X axis of the first arm 111. The second region 116 is a region on the side opposite to the second vibrating arm 120 of the first weight 112 with respect to the first imaginary center line CL1.

In the plan view including the X axis and the Y axis, the second weight 122 is configured by a first region 125 and a second region 126. The first region 125 is a region on the first vibrating arm 110 side of the second weight 122 with respect to a second imaginary center line CL2 passing the center of the width along the X axis of the second arm 121. The second region 126 is a region on the side opposite to the first vibrating arm 110 of the second weight 122 with respect to the second imaginary center line CL2.

When the mass of the first regions 115 and 125 is represented as first mass M1 and the mass of the second regions 116 and 126 is represented as second mass M2, a mass ratio M2/M1 between the first region 115 and the second region 116 of the first weight 112 and a mass ratio M2/M1 between the first region 125 and the second region 126 of the second weight 122 are set to satisfy $0.952 < M2/M1 < 1.000$.

FIG. 4 shows a relation between the mass ratio M2/M1 and the Q value obtained by considering only a vibration leak of the vibrating element 100. The vertical axis of FIG. 4 represents the Q value of the vibrating element 100 and the horizontal axis of FIG. 4 represents the mass ratio M2/M1. The Q value in FIG. 4 is a value standardized by the Q value at the time of the mass ratio M2/M1=1. As shown in FIG. 4, the vibrating element 100, the mass ratio M2/M1 of which is larger than 0.952 and smaller than 1.000, can obtain the Q value higher than the Q value of a vibrating element, the mass ratio M2/M1 of which is 1.000, that is, a vibrating element in which the center of gravity of the first weight 112 and the first imaginary center line CL1 coincide and the center of gravity of the second weight 122 and the second imaginary center line CL2 coincide.

Further, the mass ratio M2/M1 between the first region 115 and the second region 116 of the first weight 112 and the mass ratio M2/M1 between the first region 125 and the second region 126 of the second weight 122 are preferably set to satisfy $0.957 < M2/M1 < 0.991$. As shown in FIG. 4, the vibrating element 100, the mass ratio M2/M1 of which is larger than 0.957 and smaller than 0.991, can obtain the Q value 10% or more higher than the Q value of the vibrating element, the mass ratio M2/M1 of which is 1.000.

On at least one principal plane of a pair of principal planes in the plan view including the X axis and the Y axis of the vibrating element 100, the area of the first regions 115 and 125 is represented as a first area S1 and the area of the second regions 116 and 126 is represented as a second area S2. The vibrating element 100 in this embodiment is formed by a quartz crystal substrate having substantially uniform thickness along the Z axis. Therefore, the mass ratio M2/M1 of the first weight 112 and the second weight 122 is considered to be effectively the same as an area ratio S2/S1.

Therefore, when mass per unit area of the first weight 112 and mass per unit area of the second weight 122 are the same, the area ratio S2/S1 between the first region 115 and the second region 116 of the first weight 112 and the area ratio S2/S1 between the first region 125 and the second region 126 of the second weight 122 are considered to be set to satisfy 0.952<S2/S1<1.000. The same effects as the effects explained above can be achieved.

The area ratio S2/S1 between the first region 115 and the second region 116 of the first weight 112 and the area ratio S2/S1 between the first region 125 and the second region 126 of the second weight 122 are considered to be preferably set to satisfy 0.957<S2/S1<0.991. The same effects as the effects explained above can be achieved.

According to this embodiment, the following effects can be obtained.

The vibrating element 100 is configured such that the mass ratio M2/M1 between the first region 115 and the second region 116 configuring the first weight 112 and the mass ratio M2/M1 between the first region 125 and the second region 126 configuring the second weight 122 satisfy 0.952<M2/M1<1.000. The inventor found that the Q value of the vibrating element 100, the mass ratio M2/M1 of which is 0.952<M2/M1<1.000, is further improved than the Q value of a vibrating element, the mass ratio M2/M1 of which is 1.000. Therefore, it is possible to provide the vibrating element 100 having a high Q value.

The first region 115 and the second region 116 configuring the first weight 112 of the vibrating element 100 and the first region 125 and the second region 126 configuring the second weight 122 of the vibrating element 100 are formed by a quartz crystal substrate having substantially uniform thickness. The vibrating element 100 is configured such that the area ratio S2/S1 between the first region 115 and the second region 116 and the area ratio S2/S1 between the first region 125 and the second region 126 satisfy 0.952<S2/S1<1.000. The inventor found that the Q value of the vibrating element 100, the area ratio S2/S1 of which is 0.952<S2/S1<1.000, is further improved than the Q value of a vibrating element, the area ratio S2/S1 of which is 1.000. Therefore, it is possible to provide the vibrating element 100 having a high Q value.

The vibrating element 100 is configured such that the mass ratio M2/M1 between the first region 115 and the second region 116 configuring the first weight 112 and the mass ratio M2/M1 between the first region 125 and the second region 126 configuring the second weight 122 satisfy 0.957<M2/M1<0.991. The inventor found that the Q value of the vibrating element 100, the mass ratio M2/M1 of which is 0.957<M2/M1<0.991, is 10% or more improved than the Q value of a vibrating element, the mass ratio M2/M1 of which is 1.000. Therefore, it is possible to provide the vibrating element 100 having a higher Q value.

The first region 115 and the second region 116 configuring the first weight 112 of the vibrating element 100 and the first region 125 and the second region 126 configuring the second weight 122 of the vibrating element 100 are formed by a quartz crystal substrate having substantially uniform thickness. The vibrating element 100 is configured such that the area ratio S2/S1 between the first region 115 and the second region 116 and the area ratio S2/S1 between the first region 125 and the second region 126 satisfy 0.957<S2/S1<0.0991. The inventor found that the Q value of the vibrating element 100, the area ratio S2/S1 of which is 0.957<S2/S1<0.991, is 10% or more improved than the Q value of a vibrating element, the area ratio S2/S1 of which is 1.000. Therefore, it is possible to provide the vibrating element 100 having a higher Q value.

The vibrating element 100 is configured such that, the corner on the side apart from the distal end of the first arm 111 and the side apart from the second weight 122 in the first weight 112 and the corner on the side apart from the distal end of the second arm 121 and the side apart from the first weight 112 in the second weight 122 are chamfered, whereby the mass ratio M2/M1 satisfies 0.952<M2/M1<1.000. Therefore, it is possible to provide the vibrating element 100 having a high Q value. By chamfering the first weight 112 and the second weight 122 in this way, it is also possible to secure a sufficient interval between the vibrating element 100 and the package 10. Therefore, it is also possible to reduce likelihood that the vibrating element 100 is broken when the vibrating element 100 and the package 10 come into contact.

The vibrator 1 includes the vibrating element 100 configured such that, the corner on the side apart from the distal end of the first arm 111 and the side apart from the second weight 122 in the first weight 112 and the corner on the side apart from the distal end of the second arm 121 and the side apart from the first weight 112 in the second weight 122 are chamfered, whereby the mass ratio M2/M1 satisfies 0.952<M2/M1<1.000. Therefore, it is possible to provide the vibrator 1 having a high Q ratio.

Modifications of the first embodiment are explained below.

Vibrating elements in the modifications explained below are the same as the vibrating element 100 explained in the first embodiment except that the configurations of the first weight 112 and the second weight 122 in the first embodiment are different. Since the configuration of the second weight is symmetrical to the configuration of the first weight with respect to the Y axis. Therefore, explanation of the configuration of the second weight is omitted. In the figures referred to in the following explanation, the same components as the components in the first embodiment are denoted by the same reference numerals and signs and redundant explanation of the components is omitted.

2. Modification 1

Figure 5:
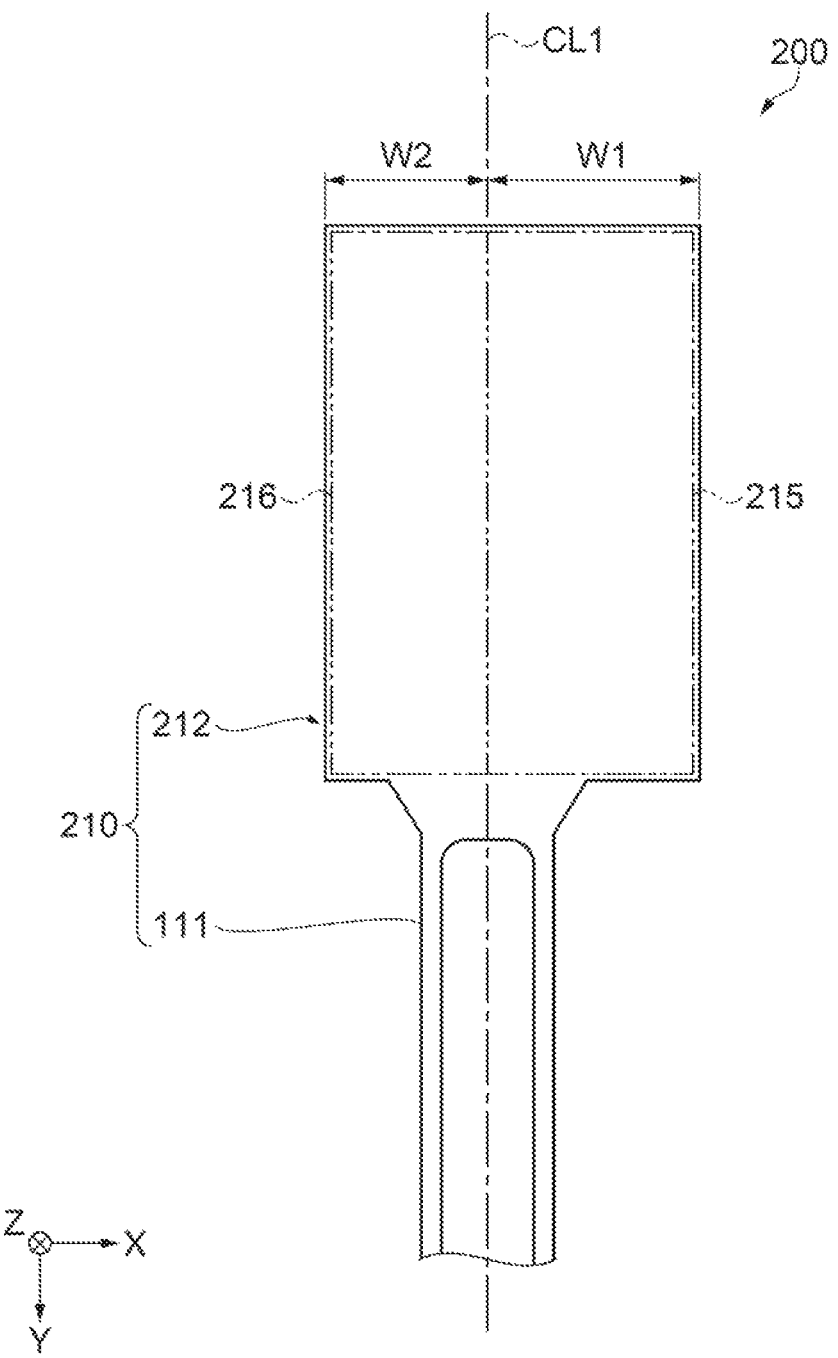
FIG. 5 is a plan view enlarging and showing a first weight of a vibrating element according to a modification 1.

FIG. 5 is a plan view enlarging and showing a first weight of a vibrating element according to a modification 1.

A vibrating element 200 includes the base 130 and a first vibrating arm 210 and a not-shown second vibrating arm extending from the base 130 to the minus side of the Y axis and arranged side by side along the X axis. The first vibrating arm 210 includes the first arm 111 extending from the base 130 and a first weight 212 coupled to the distal end of the first arm 111. The first weight 212 is formed in a long rectangular shape along the Y axis. The thickness along the Z axis of the first weight 212 is substantially uniform. The width along the X axis of the first weight 212 is larger than the width along the X axis of the first arm 111.

The first weight 212 is configured by a first region 215 and a second region 216 in the plan view including the X axis and the Y axis. The first region 215 is a region on the second vibrating arm side of the first weight 212 with respect to the first imaginary center line CL1 of the width along the X axis of the first arm 111. The second region 216 is a region on a side opposite to the second vibrating arm of the first weight 212 with respect to the first imaginary center line CL1. Width W1 along the X axis of the first region 215 is larger than width W2 along the X axis of the second region 216.

The mass of the first region 215 is the first mass M1. The mass of the second region 216 is the second mass M2. The area of the first region 215 is the first area S1. The area of the second region 216 is the second area S2. By differentiating the width W1 of the first region 215 and the width W2 of the second region 216 in this way, the first weight 212 is configured such that the mass ratio M2/M1 satisfies 0.952<M2/M1<1.000. The first weight 212 is configured such that the area ratio S2/S1 of the first weight 212 satisfies 0.952<S2/S1<1.000. Consequently, it is possible to obtain the vibrating element 200 having a high Q value as in the first embodiment.

3. Modification 2

Figure 6:
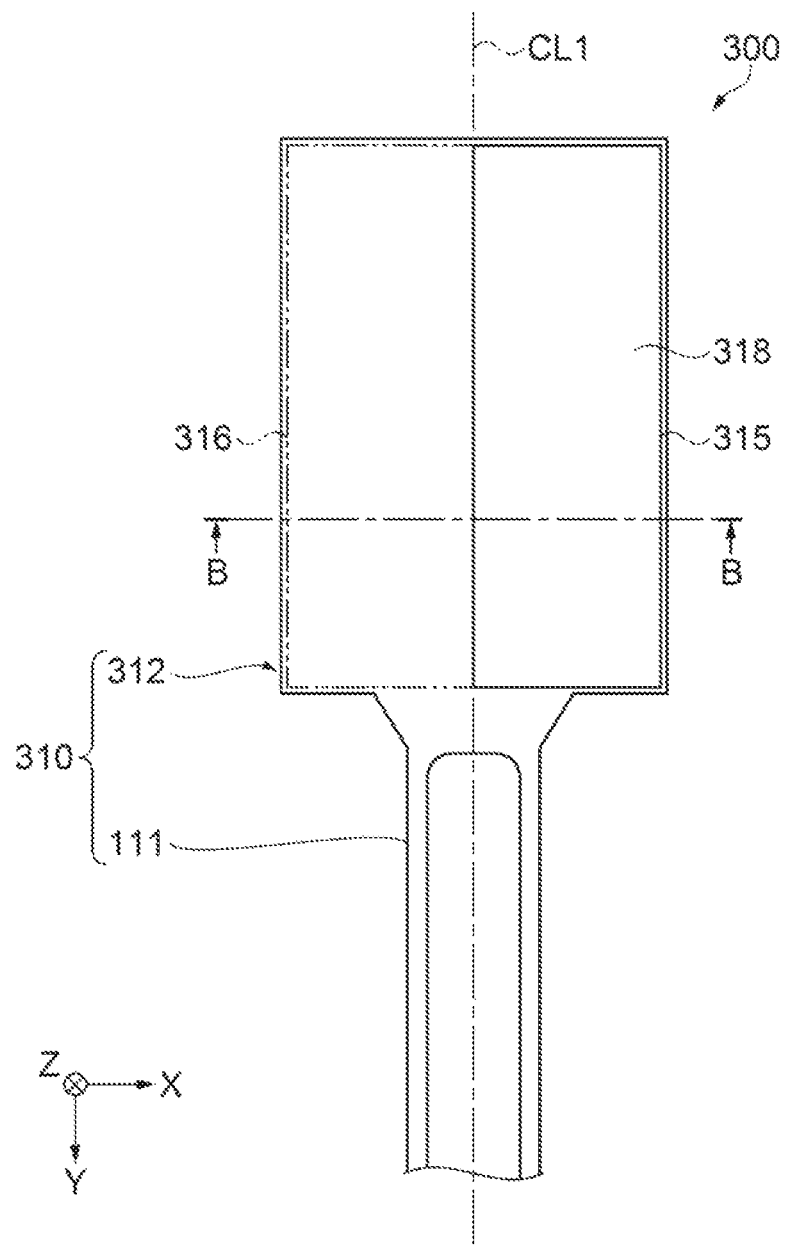
FIG. 6 is a plan view enlarging and showing a first weight of a vibrating element according to a modification 2.
Figure 7:
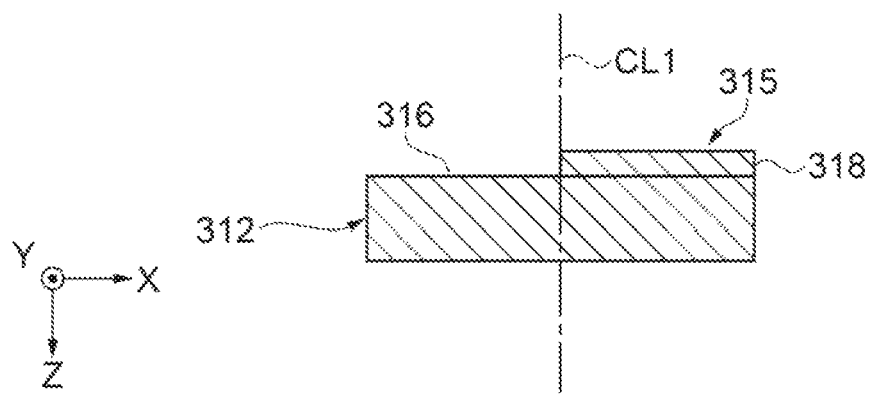
FIG. 7 is a sectional view taken along a B-B line in FIG. 6.

FIG. 6 is a plan view enlarging and illustrating a first weight of a vibrating element according to a modification 2. FIG. 7 is a sectional view taken along a B-B line in FIG. 6.

A vibrating element 300 includes the base 130 and a first vibrating arm 310 and a not-shown second vibrating arm extending from the base 130 to the minus side of the Y axis and arranged side by side along the X axis. The first vibrating arm 310 includes the first arm 111 extending from the base 130 and a first weight 312 coupled to the distal end of the first arm 111. The first weight 312 is formed in a long rectangular shape along the Y axis. The width along the X axis of the first weight 312 is larger than the width along the X axis of the first arm 111. The first weight 312 is configured symmetrical with respect to the first imaginary center line CL1 passing the center of the width along the X axis of the first arm 111 in the plan view including the X axis and the Y axis.

The first weight 312 is configured by a first region 315 and a second region 316 in the plan view. The first region 315 is a region on the second vibrating arm side of the first weight 312 with respect to the first imaginary center line CL1. The second region 316 is a region on a side opposite to the second vibrating arm of the first weight 312 with respect to the first imaginary center line CL1.

A metal member 318 is included in the surface of the first weight 312. Specifically, the first region 315 and the second region 316 are formed by a quartz crystal substrate having substantially uniform thickness along the Z axis. In this modification, by forming the metal member 318 on the upper surface of the first region 315, the first weight 312 is configured such that the mass ratio M2/M1 satisfies 0.952<M2/M1<1.000. Consequently, it is possible to obtain the vibrating element 300 having a high Q value as in the first embodiment.

As the metal member 318, for example, the metal material of the first and second electrodes for driving explained above can be used. In this modification, the configuration is illustrated in which the metal member 318 is formed in the first region 315. However, a configuration may also be adopted in which the metal member 318 is formed in the first region 315 and the second region 316 and the mass of the metal member 318 in the first region 315 is larger than the mass of the metal member 318 in the second region 316. A configuration may also be adopted in which the metal member 318 is formed in the first region 315 and the second region 316 and the average thickness along the Z axis of the metal member 318 in the first region 315 is larger than the average thickness along the Z axis of the metal member 318 in the second region 316.

4. Modification 3

Figure 8:
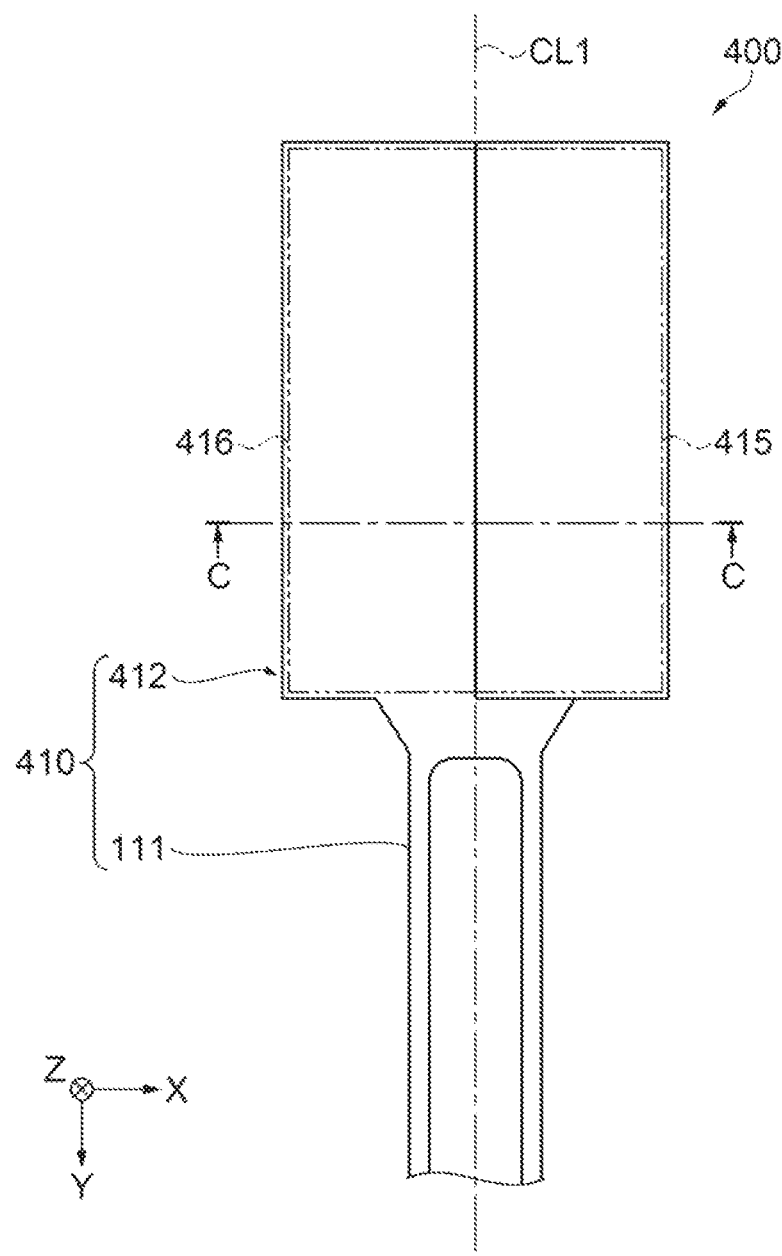
FIG. 8 is a plan view enlarging and showing a first weight of a vibrating element according to a modification 3.
Figure 9:
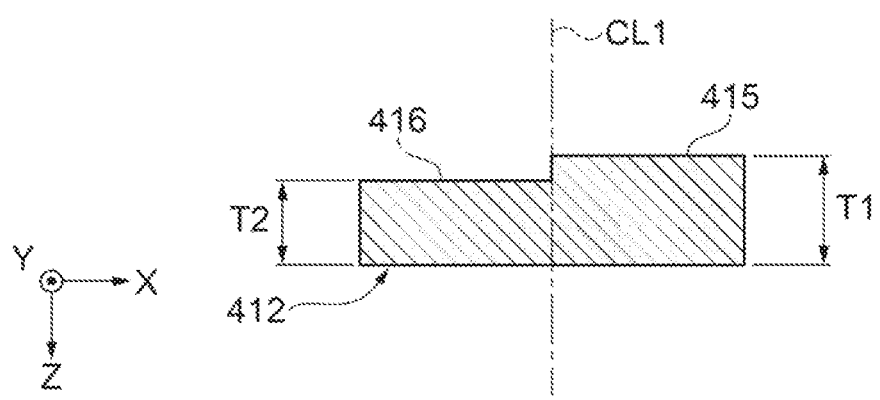
FIG. 9 is a sectional view taken along a C-C line in FIG. 8.

FIG. 8 is a plan view enlarging and showing a first weight of a vibrating element according to a modification 3. FIG. 9 is a sectional view taken along a C-C line in FIG. 8.

A vibrating element 400 includes the base 130 and a first vibrating arm 410 and a not-shown second vibrating arm extending from the base 130 to the minus side of the Y axis and arranged side by side along the X axis. The first vibrating arm 410 includes the first arm 111 extending from the base 130 and a first weight 412 coupled to the distal end of the first arm 111. The first weight 412 is formed in a long rectangular shape along the Y axis. The width along the X axis of the first weight 412 is larger than the width along the X axis of the first arm 111. The first weight 412 is configured symmetrical with respect to the first imaginary center line CL1 passing the center of the width along the X axis of the first arm 111 in the plan view including the X axis and the Y axis.

The first weight 412 is configured by a first region 415 and a second region 416 in the plan view. The first region 415 is a region on the second vibrating arm side of the first weight 412 with respect to the first imaginary center line CL1. The second region 416 is a region on a side opposite to the second vibrating arm of the first weight 412 with respect to the first imaginary center line CL1.

By setting thickness T2 along the Z axis of the second region 416 smaller than thickness T1 along the Z axis of the first region 415, the first weight 412 is configured such that the mass ratio M2/M1 satisfies 0.952<M2/M1<1.000. The first weight 412 having such a configuration can be formed by wet etching or dry etching using the photolithography technique. Consequently, it is possible to obtain the vibrating element 400 having a high Q value as in the first embodiment. The thicknesses along the Z axis of the first region 415 and the second region 416 do not need to be uniform in the respective regions. A configuration may also be adopted in which the average thickness of the second region 416 is set smaller than the average thickness along the Z axis of the first region 415.

Among the configurations of the weights explained in the first embodiment and the modifications 1 to 3, the configuration applied to the first weight and the configuration applied to the second weight may be different. The first weight and the second weight may realize the mass ratio M2/M1 satisfying 0.952<M2/M1<1.000 with a configuration obtained by appropriately combining the configurations of the weights explained in the first embodiment and the modifications 1 to 3.

5. Second Embodiment

Figure 10:
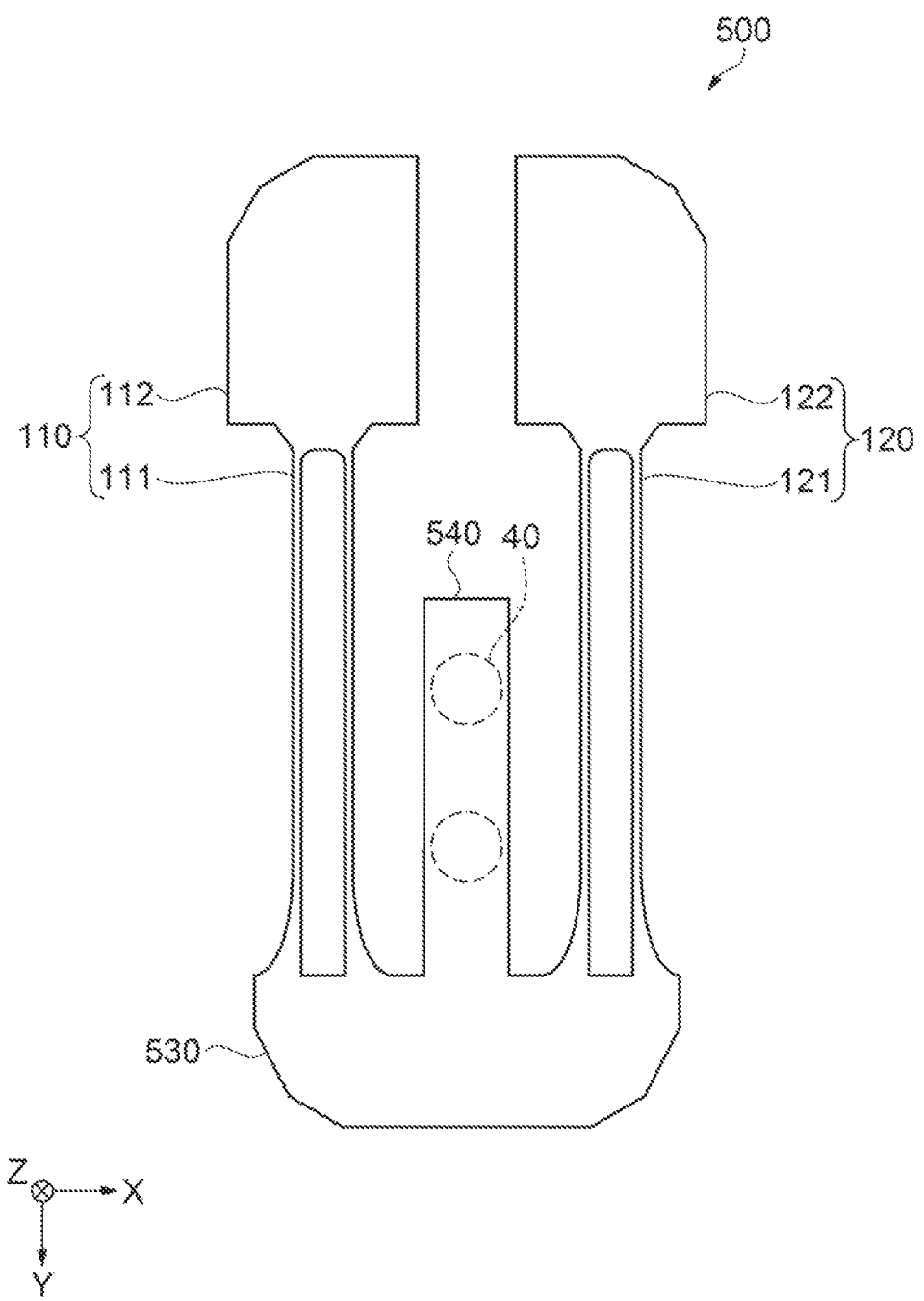
FIG. 10 is a plan view showing the configuration of a vibrating element according to a second embodiment.

FIG. 10 is a plan view showing the configuration of a vibrating element according to a second embodiment. The same components as the components in the first embodiment are denoted by the same reference numerals and signs and redundant explanation of the components is omitted.

A vibrating element 500 is configured by a Z-cut quartz crystal plate and an electrode formed on the Z-cut quartz crystal plate. The vibrating element 500 includes a base 530, the first vibrating arm 110 and the second vibrating arm 120 extending from the base 530 to the minus side of the Y axis and arranged side by side along the X axis, and a fixed section 540. The base 530 is formed in a plate shape spreading on an XY plane, which is a plane parallel to the X axis and the Y axis, and having the Z axis as a thickness direction. The fixed section 540 extends from the base 530 to between the first vibrating arm 110 and the second vibrating arm 120. The fixed section 540 is fixed to a connection terminal of a not-shown package via two conductive adhesives 40.

The vibrating element 500 is configured such that, a corner on a side apart from the distal end of the first arm 111 and a side apart from the second weight 122 in the first weight 112 and a corner on a side apart from the distal end of the second arm 121 and a side apart from the first weight 112 in the second weight 122 are chamfered in the plan view including the X axis and the Y axis, whereby the mass ratio M2/M1 satisfies 0.952<M2/M1<1.000. Therefore, it is possible to obtain the vibrating element 500 having a high Q value.

In the vibrating element 500, both corners on the plus side along the Y axis of the base 530 are also chamfered in the plan view. That is, since the four corners of the vibrating element 500 are chamfered along the shape of the inner wall of a base, the vibrating element 500 can be mounted in a package smaller than a vibrating element not chamfered. Since the interval between the vibrating element 500 and the package 10 can be sufficiently secured, it is also possible to reduce likelihood that the vibrating element 500 is broken when the vibrating element 500 and the package 10 come into contact.

6. Third Embodiment

Figure 11:
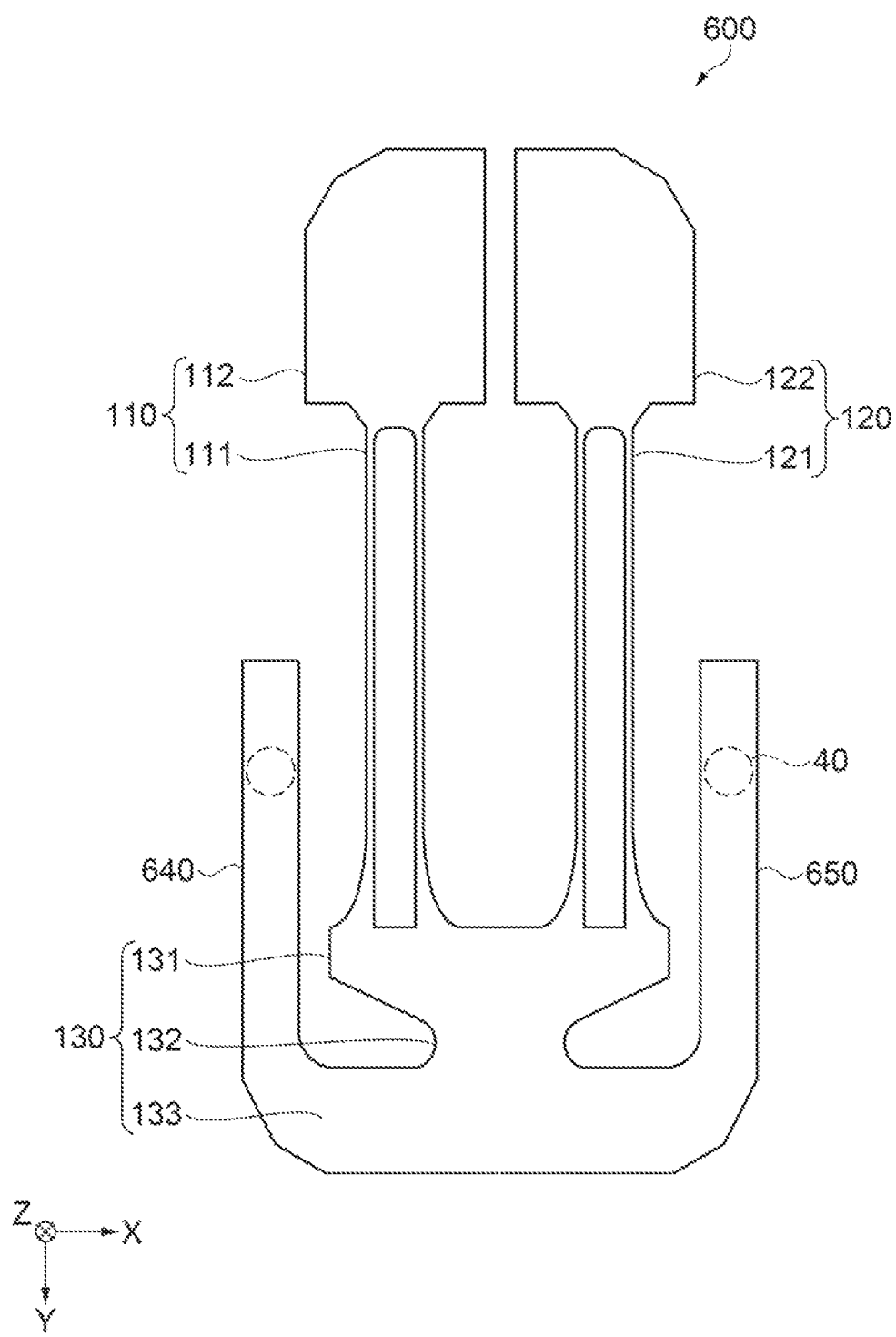
FIG. 11 is a plan view showing the configuration of a vibrating element according to a third embodiment.

FIG. 11 is a plan view showing the configuration of a vibrating element according to a third embodiment. The same components as the components in the first embodiment are denoted by the same reference numerals and signs and redundant explanation of the components is omitted.

A vibrating element 600 is configured by a Z-cut quartz crystal plate and an electrode formed on the Z-cut quartz crystal plate. The vibrating element 600 includes the base 130, the first vibrating arm 110 and the second vibrating arm 120 extending from the base 130 to the minus side of the Y axis and arranged side by side along the X axis, a first holding arm 640, and a second holding arm 650. The first holding arm 640 extends from the minus side along the X axis of the second base 133 to the minus side along the X axis and further extends to the minus side along the Y axis along the first arm 111. The second holding arm 650 extends from the plus side along the X axis of the second base 133 to the plus side along the X axis and further extends to the minus side along the Y axis along the second arm 121. The first holding arm 640 and the second holding arm 650 are fixed to a connection terminal of a not-shown package via the conductive adhesives 40.

The vibrating element 600 is configured such that, a corner on a side apart from the distal end of the first arm 111 and a side apart from the second weight 122 in the first weight 112 and a corner on a side apart from the distal end of the second arm 121 and a side apart from the first weight 112 in the second weight 122 are chamfered in the plan view including the X axis and the Y axis, whereby the mass ratio M2/M1 satisfies 0.952<M2/M1<1.000. Therefore, it is possible to obtain the vibrating element 600 having a high Q value.

In the vibrating element 600, a corner formed by the minus side along the X axis and the plus side along the Y axis of the first holding arm 640 and a corner formed by the plus side along the X axis and the plus side along the Y axis of the second holding arm 650 are chamfered in the plan view. That is, since the four corners of the vibrating element 600 are chamfered along the shape of the inner wall of a base, the vibrating element 600 can be mounted in a package smaller than a vibrating element not chamfered. Since the interval between the vibrating element 600 and the package 10 can be sufficiently secured, it is also possible to reduce likelihood that the vibrating element 600 is broken when the vibrating element 600 and the package 10 come into contact.

7. Fourth Embodiment

Figure 12:
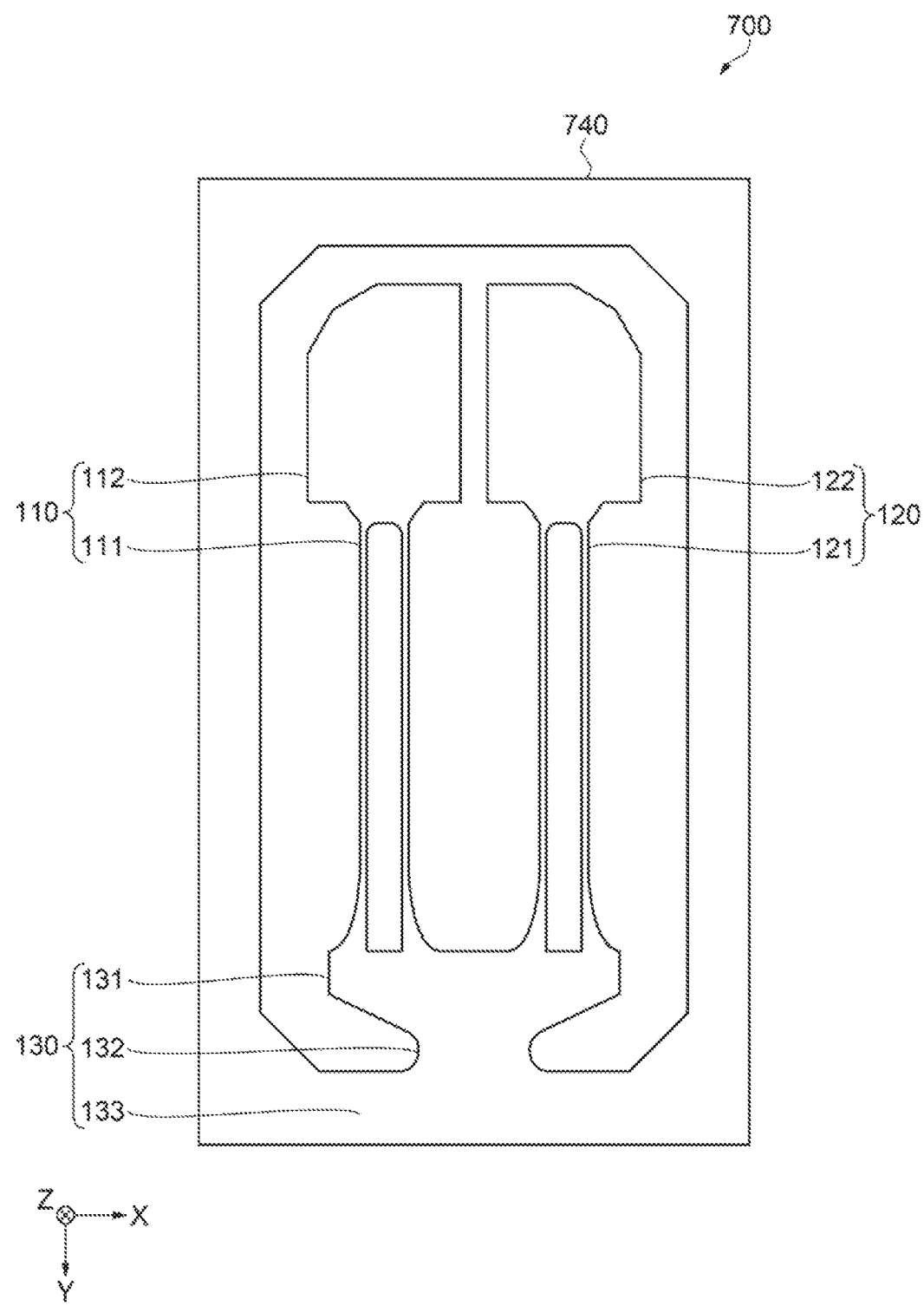
FIG. 12 is a plan view showing the configuration of a vibrating element according to a forth embodiment.

FIG. 12 is a plan view showing the configuration of a vibrating element according to a fourth embodiment. The same components as the components in the first embodiment are denoted by the same reference numerals and signs and redundant explanation of the components is omitted.

A vibrating element 700 is configured by a Z-cut quartz crystal plate and an electrode formed on the Z-cut quartz crystal plate. The vibrating element 700 includes the base 130, the first vibrating arm 110 and the second vibrating arm 120 extending from the base 130 to the minus side of the Y axis and arranged side by side along the X axis, and a holding frame 740. The holding frame 740 extends from the plus and minus sides along the X axis of the second base 133 and surrounds the first base 131, the first vibrating arm 110, and the second vibrating arm 120 in a frame shape. Not-shown metal layers are formed on the upper and lower surfaces of the holding frame 740. The metal layers and a not-shown lid and a not-shown base made of, for example, the same material as the vibrating element 700 are anodically bonded to form a package. The first base 131, the first vibrating arm 110, and the second vibrating arm 120 are housed in the package.

The vibrating element 700 is configured such that, a corner on a side apart from the distal end of the first arm 111 and a side apart from the second weight 122 in the first weight 112 and a corner on a side apart from the distal end of the second arm 121 and a side apart from the first weight 112 in the second weight 122 are chamfered in the plan view including the X axis and the Y axis, whereby the mass ratio M2/M1 satisfies 0.952<M2/M1<1.000. Therefore, it is possible to obtain the vibrating element 700 having a high Q value.

In the embodiments and the modifications explained above, the configuration is illustrated in which the first vibrating arms 110, 210, 310, and 410 and the second vibrating arm 120 extend from the bases 130 and 530 to the minus side along the Y axis. However, not only this, but it is evident that the same effects as the effects in the embodiments and the modifications are achieved by a configuration in which the first vibrating arms 110, 210, 310, and 410 and the second vibrating arm 120 extend from the bases 130 and 530 to the plus side along the Y axis.

Similarly, in the embodiments and the modifications, the configuration is illustrated in which the vibrating elements 100, 200, 300, 400, 500, and 600 are electrically coupled to the connection terminals 23 and 24 via the conductive adhesives 40 on the surface side on the plus side of the surfaces crossing the Z axis. However, not only this, but it is evident that the same effects as the effects in the embodiments and the modifications are achieved by a configuration in which vibrating elements 100, 200, 300, 400, 500, and 600 are electrically coupled to the connection terminals 23 and 24 via the conductive adhesives on a surface side on the minus side of the surfaces crossing the Z axis.

8. Fifth Embodiment

Figure 13:
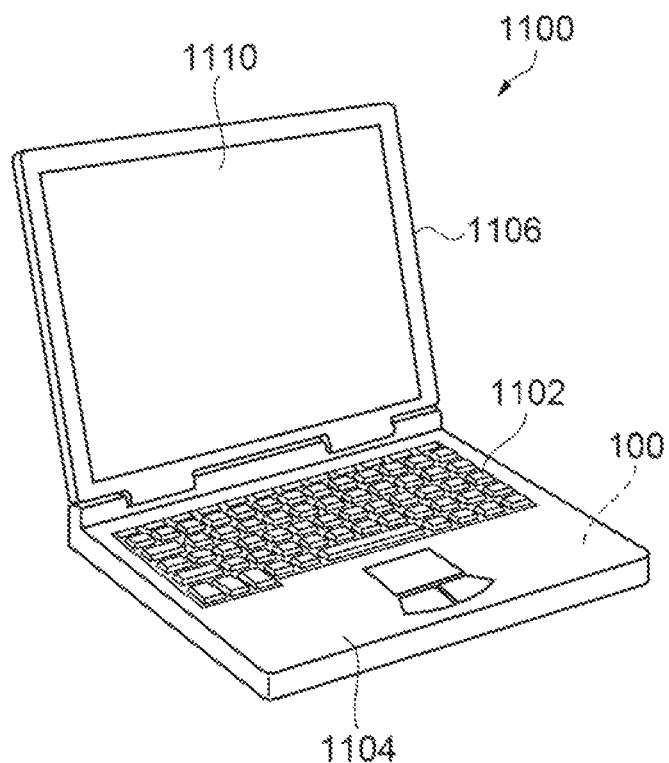
FIG. 13 is a perspective view showing an example of a personal computer according to a fifth embodiment.

FIG. 13 is a perspective view showing an example of a personal computer according to a fifth embodiment. A personal computer 1100 functioning as an electronic device is configured by a main body section 1104 including a keyboard 1102 and a display unit 1106 including a display section 1110. The display unit 1106 is supported via a hinge structure section to be turnable with respect to the main body section 1104. The vibrating element 100 functioning as a filter, a resonator, a reference clock, and the like is incorporated in such a personal computer 1100. The personal computer 1100 can enjoy the effects of the vibrating element explained above and can exert high reliability.

9. Sixth Embodiment

Figure 14:
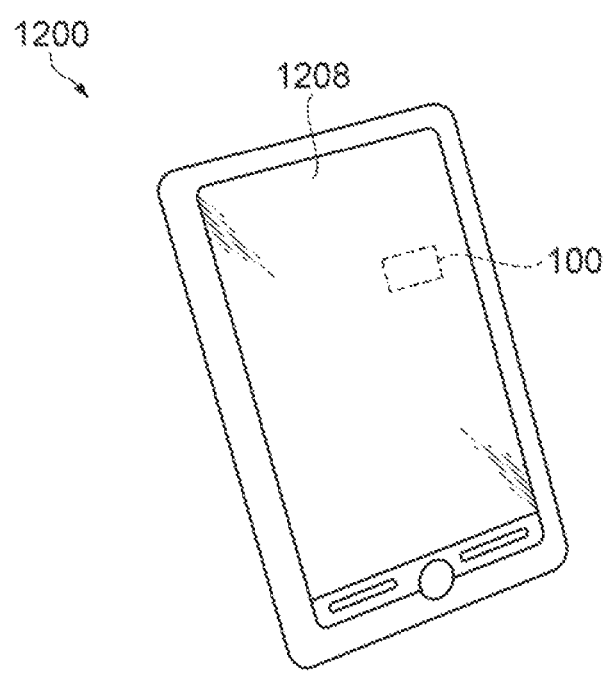
FIG. 14 is a perspective view showing an example of a smartphone according to a sixth embodiment.

FIG. 14 is a perspective view showing an example of a smartphone according to a sixth embodiment. A smartphone 1200 functioning as an electronic device shown in FIG. 14 includes a display section 1208. The display section 1208 is configured by a liquid crystal panel and a touch panel. The display section 1208 receives various kinds of operation and displays images and the like. The vibrating element 100 functioning as a filter, a resonator, a reference clock, and the like is incorporated in such a smartphone 1200. The smartphone 1200 can enjoy the effects of the vibrating element explained above and can exert high reliability.

10. Seventh Embodiment

Figure 15:
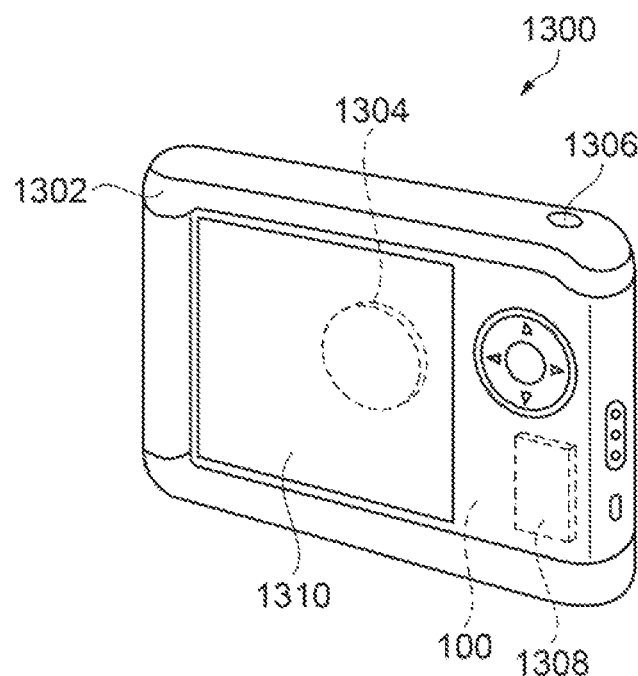
FIG. 15 is a perspective view showing an example of a digital still camera according to a seventh embodiment.

FIG. 15 is a perspective view showing an example of a digital still camera according to a seventh embodiment. A digital still camera 1300 functioning as an electronic device photoelectrically converts a light image of a subject with an imaging device such as a CCD (Charge Coupled Device) and generates an imaging signal.

A display section 1310 is provided on the rear surface of a case 1302 in the digital still camera 1300 and is configured to perform display based on the imaging signal generated by the CCD. The display section 1310 functions as a finder that displays the subject as an electronic image. A light receiving unit 1304 including an optical lens and a CCD is provided on the front side of the case 1302.

When a photographer confirms a subject image displayed on the display section 1310 and presses a shutter button 1306, an imaging signal of the CCD at that point in time is transferred to and stored in a memory 1308. The imaging signal stored in the memory 1308 is output to the display section 1310 or output to an external device, which is coupled by radio or wire, by predetermined operation. The vibrating element 100 functioning as a filter, a resonator, a reference clock, and the like is incorporated in such a digital still camera 1300. The digital still camera 1300 can enjoy the effects of the vibrating element explained above and can exert high reliability.

The electronic device including the vibrating element according to the present disclosure can be applied to, besides the personal computer, the smartphone, and the digital still camera explained in the fifth to seventh embodiments, for example, an inkjet printer, a tablet computer, a television, a digital video camera, a Blue-ray recorder, a car navigation device, an electronic organizer, an electronic dictionary, an electronic calculator, an electronic game machine, a work station, a videophone, a television monitor for crime prevention, electronic binoculars, a POS terminal, medical equipment, a fish finder, various measurement instruments, meters, and a flight simulator. As the medical equipment, an electronic thermometer, a manometer, a blood glucose meter, an electrocardiographic device, an ultrasonic diagnosis device, an electronic endoscope, and the like can be illustrated. As the meters, meters of a vehicle, an airplane, and a ship and the like can be illustrated.

11. Eighth Embodiment

Figure 16:
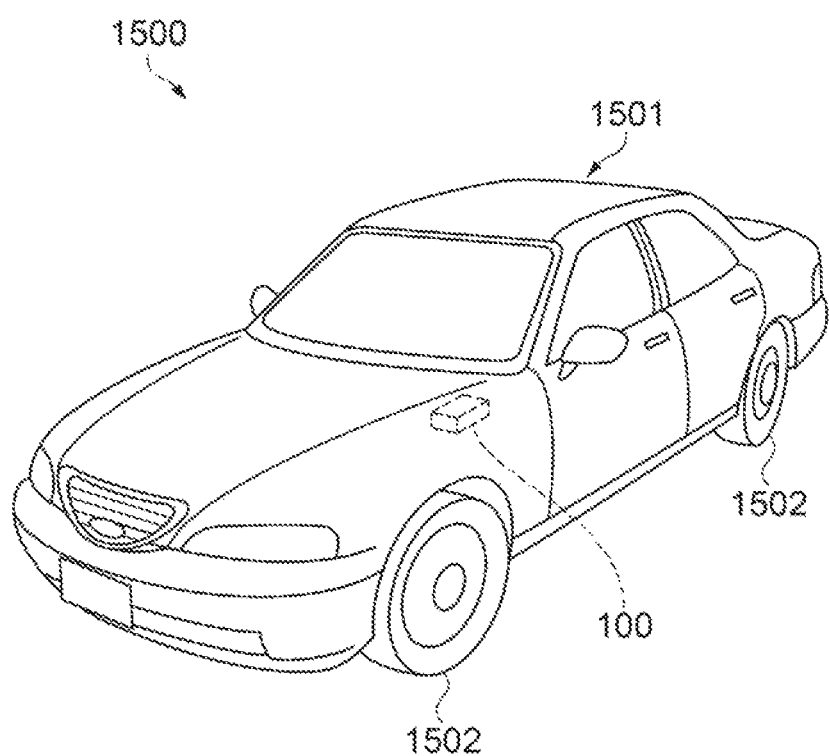
FIG. 16 is a perspective view showing an example of an automobile according to an eighth embodiment.

FIG. 16 is a perspective view showing an example of an automobile according to an eighth embodiment. An automobile 1500 functioning as a vehicle includes a vehicle body 1501 and four wheels 1502. The automobile 1500 is configured to rotate the wheels 1502 with a not-shown engine or motor provided in the vehicle body 1501.

The vibrating element 100 functioning as a filter, a resonator, a reference clock, and the like is incorporated in such an automobile 1500. The automobile 1500 can enjoy the effects of the vibrating element explained above and can exert high reliability.

The vehicle including the vibrating element according to the present disclosure is not limited to the automobile and can also be applied to, for example, other vehicles such as a motorbike and a railroad vehicle, an airplane, a ship, and a spaceship.

The vibrating element is not limited to the filter, the resonator, and the reference clock and can also be applied to a sensor such as a gyro sensor.

Contents derived from the embodiments are described below.

A vibrating element includes: a base; and a first vibrating arm and a second vibrating arm extending from the base along a first axis and arranged side by side along a second axis crossing the first axis. The first vibrating arm includes a first arm extending from the base and a first weight coupled to a distal end of the first arm. The second vibrating arm includes a second arm extending from the base and a second weight coupled to a distal end of the second arm. In the vibrating element, $0.952<M2/M1<1.000$, wherein M1 is mass on the second vibrating arm side of the first weight with respect to a first imaginary center line passing a center of width along the second axis of the first arm and mass on the first vibrating arm side of the second weight with respect to a second imaginary center line passing a center of width along the second axis of the second arm and M2 is mass on a side opposite to the second vibrating arm of the first weight with respect to the first imaginary center line and mass on a side opposite to the first vibrating arm of the second weight with respect to the second imaginary center line.

With this configuration, the mass ratio M2/M1 in the first weight and the second weight of the vibrating element is $0.952<M2/M1<1.000$. The inventor found that the Q value of the vibrating element is improved compared with the Q value of a vibrating element having the mass ratio $M2/M1=1$ by setting the mass ratio M2/M1 of the first weight and the second weight to $0.952<M2/M1<1.000$. Consequently, it is possible to provide the vibrating element having a high Q value.

It is preferable that, in the vibrating element, width along the second axis of the first weight is larger than the width along the second axis of the first arm, width along the second axis of the second weight is larger than the width along the second axis of the second arm, and, in a plan view including the first axis and the second axis, $0.952<S2/S1<1.000$, wherein S1 is an area on the second vibrating arm side of the first weight with respect to the first imaginary center line and an area on the first vibrating arm side of the second weight with respect to the second imaginary center line and S2 is an area on the side opposite to the second vibrating arm of the first weight with respect to the first imaginary center line and an area on the side opposite to the first vibrating arm of the second weight with respect to the second imaginary center line.

With this configuration, the area ratio S2/S1 in the first weight and the second weight of the vibrating element is 0.952<S2/S1<1.000. The inventor found that the Q value of the vibrating element is improved compared with the Q value of a vibrating element having the area ratio S2/S1=1 by setting the area ratio S2/S1 of the first weight and the second weight to 0.952<S2/S1<1.000. Consequently, it is possible to provide the vibrating element having a high Q value.

In the vibrating element, it is preferable that 0.957<M2/M1<0.991.

With this configuration, it is possible to realize the vibrating element having a further improved Q value by setting the mass ratio M2/M1 of the first weight and the second weight of the vibrating element to 0.957<M2/M1<0.991.

In the vibrating element, it is preferable that 0.957<S2/S1<0.991.

With this configuration, it is possible to realize the vibrating element having a further improved Q value by setting the area ratio S2/S1 of the first weight and the second weight of the vibrating element to 0.957<S2/S1<0.991.

In the vibrating element, it is preferable that, in a plan view including the first axis and the second axis, the first weight and the second weight are formed in a rectangular shape, a corner on a side apart from the distal end of the first arm and a side apart from the second weight in the first weight is chamfered and a corner on a side apart from the distal end of the second arm and a side apart from the first weight in the second weight is chamfered.

With this configuration, it is possible to suitably realize the vibrating element, the mass ratio M2/M1 of the first weight and the second weight of which is 0.952<M2/M1<1.000, and the vibrating element, the area ratio S2/S1 of the first weight and the second weight of which is 0.952<S2/S1<1.000.

In the vibrating element, it is preferable that the vibrating element includes a metal member on a surface of at least one of the first weight and the second weight.

With this configuration, the mass ratio M2/M1 of the first weight and the second weight can be adjusted by the metal member.

A vibrator includes: the vibrating element; and a package that houses the vibrating element.

With this configuration, the vibrator includes the vibrating element configured such that the mass ratio M2/M1 satisfies 0.952<M2/M1<1.000 or 0.957<M2/M1<0.991 or the area ratio S2/S1 satisfies 0.952<S2/S1<1.000 or 0.957<S2/S1<0.991. Therefore, it is possible to provide the vibrator having a high Q value.

An electronic device includes the vibrating element.

With this configuration, the electronic device can enjoy the effects of the vibrating element and can exert high reliability.

A vehicle includes the vibrating element.

With this configuration, the vehicle can enjoy the effects of the vibrating element and can exert high reliability.

What is claimed is:

1. A vibrating element comprising:
    a base; and
    a first vibrating arm and a second vibrating arm extending from the base along a first axis and arranged side by side along a second axis crossing the first axis, wherein
    the first vibrating arm includes a first arm extending from the base and a first weight coupled to a distal end of the first arm,
    the second vibrating arm includes a second arm extending from the base and a second weight coupled to a distal end of the second arm, and
    0.952<M2/M1<1.000, wherein M1 is mass on the second vibrating arm side of the first weight with respect to a first imaginary center line passing a center of width along the second axis of the first arm and mass on the first vibrating arm side of the second weight with respect to a second imaginary center line passing a center of width along the second axis of the second arm and M2 is mass on a side opposite to the second vibrating arm of the first weight with respect to the first imaginary center line and mass on a side opposite to the first vibrating arm of the second weight with respect to the second imaginary center line,
    wherein in a plan view including the first axis and the second axis,
    the first weight and the second weight are formed in a rectangular shape,
    a corner on a side apart from the distal end of the first arm and a side apart from the second weight in the first weight is chamfered, and
    a corner on a side apart from the distal end of the second arm and a side apart from the first weight in the second weight is chamfered.

2. The vibrating element according to claim 1, wherein
    width along the second axis of the first weight is larger than the width along the second axis of the first arm,
    width along the second axis of the second weight is larger than the width along the second axis of the second arm, and
    in a plan view including the first axis and the second axis, 0.952<S2/S1<1.000, wherein S1 is an area on the second vibrating arm side of the first weight with respect to the first imaginary center line and an area on the first vibrating arm side of the second weight with respect to the second imaginary center line and S2 is an area on the side opposite to the second vibrating arm of the first weight with respect to the first imaginary center line and an area on the side opposite to the first vibrating arm of the second weight with respect to the second imaginary center line.

3. The vibrating element according to claim 1, wherein 0.957<M2/M1<0.991.

4. The vibrating element according to claim 2, wherein 0.957<S2/S1<0.991.

5. The vibrating element according to claim 1, wherein the vibrating element includes a metal member on a surface of at least one of the first weight and the second weight.

6. A vibrator comprising:
    the vibrating element according to claim 1; and
    a package that houses the vibrating element.

7. An electronic device comprising the vibrating element according to claim 1.

8. A vehicle comprising the vibrating element according to claim 1.

* * * * *